United States Patent
Nakano et al.

(10) Patent No.: US 9,614,295 B2
(45) Date of Patent: Apr. 4, 2017

(54) JOINING METHOD, JOINT STRUCTURE, ELECTRONIC DEVICE, METHOD FOR MANUFACTURING ELECTRONIC DEVICE AND ELECTRONIC PART

(71) Applicant: Murata Manufacturing Co., Ltd., Nagaokakyo-shi, Kyoto-fu (JP)

(72) Inventors: Kosuke Nakano, Nagaokakyo (JP); Hidekiyo Takaoka, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/918,648

(22) Filed: Oct. 21, 2015

(65) Prior Publication Data

US 2016/0043480 A1    Feb. 11, 2016

Related U.S. Application Data

(60) Division of application No. 13/904,072, filed on May 29, 2013, now Pat. No. 9,209,527, which is a
(Continued)

(30) Foreign Application Priority Data

Dec. 24, 2010  (JP) ................................. 2010-287782
Jul. 21, 2011   (JP) ................................. 2011-159922

(51) Int. Cl.
*B23K 101/36*    (2006.01)
*H01R 4/02*       (2006.01)
(Continued)

(52) U.S. Cl.
CPC ................. *H01R 4/02* (2013.01); *B23K 1/00* (2013.01); *B23K 1/0016* (2013.01);
(Continued)

(58) Field of Classification Search
CPC ............ B23K 2201/40; B23K 35/0238; B23K 35/262; B23K 35/264; H05K 3/3463;
(Continued)

(56) References Cited

U.S. PATENT DOCUMENTS 6,602,777 B1    8/2003   Kao et al.
7,064,446 B2    6/2006   Barnak et al.
(Continued)

FOREIGN PATENT DOCUMENTS

CN    1825578 A    8/2006
CN    1930672 A    3/2007
(Continued)

OTHER PUBLICATIONS

PCT/JP2011/079781 Written Opinion dated Mar. 27, 2012.

*Primary Examiner* — Erin Saad
(74) *Attorney, Agent, or Firm* — Arent Fox LLP

(57) ABSTRACT

A joint structure that includes a first metal member, a second metal member, and a joint portion sandwiched between the first metal member and the second metal member. At least a Cu-M-Sn intermetallic compound is dispersed in the joint portion, M is at least one of Ni and Mn, and neither a $Cu_3Sn$ layer nor a $Cu_6Sn_5$ layer is present on at least one of interfaces between the joint portion and the first metal member and the second metal member.

5 Claims, 2 Drawing Sheets

Related U.S. Application Data continuation of application No. PCT/JP2011/079781, filed on Dec. 22, 2011.

(51) Int. Cl.

| | | |
|---|---|---|
| B23K 35/02 | (2006.01) | |
| B23K 35/26 | (2006.01) | |
| C22C 9/05 | (2006.01) | |
| C22C 9/06 | (2006.01) | |
| C22C 13/00 | (2006.01) | |
| C22C 13/02 | (2006.01) | |
| H05K 3/34 | (2006.01) | |
| B23K 1/00 | (2006.01) | |
| H01R 4/58 | (2006.01) | |

(52) U.S. Cl.
CPC ...... *B23K 35/0238* (2013.01); *B23K 35/0244* (2013.01); *B23K 35/262* (2013.01); *C22C 9/05* (2013.01); *C22C 9/06* (2013.01); *C22C 13/00* (2013.01); *C22C 13/02* (2013.01); *H01R 4/58* (2013.01); *H05K 3/3463* (2013.01); *H05K 2201/0272* (2013.01); *Y10T 403/479* (2015.01)

(58) Field of Classification Search
CPC ......... H01L 24/33; H01L 24/40; H01L 24/97; H01L 2924/00015; H01L 2924/01012; H01L 2924/01014; H01L 2924/01015; H01L 2924/01023; H01L 2924/01044; H01L 2924/01073; H01L 2924/01074; H01L 2924/01087

See application file for complete search history.

(56) References Cited

U.S. PATENT DOCUMENTS

| | | |
|---|---|---|
| 7,274,103 B2 | 9/2007 | Ikeda et al. |
| 8,794,498 B2 | 8/2014 | Kimura et al. |
| 2005/0212133 A1 | 9/2005 | Barnak et al. |
| 2005/0218525 A1 | 10/2005 | Takahashi et al. |
| 2006/0186550 A1 | 8/2006 | Ikeda et al. |
| 2007/0051441 A1* | 3/2007 | Takano ............... C22C 9/04 148/684 |
| 2007/0074790 A1* | 4/2007 | Yamakoshi ........... C22C 19/03 148/426 |
| 2007/0245852 A1 | 10/2007 | Takaoka et al. |
| 2008/0308189 A1* | 12/2008 | Lee ............... B23K 35/262 148/23 |
| 2009/0148720 A1 | 6/2009 | Kitayama et al. |
| 2010/0266870 A1 | 10/2010 | Nishimura |
| 2010/0269963 A1* | 10/2010 | Hirose ................ C22F 1/08 148/685 |
| 2011/0268977 A1 | 11/2011 | Kimura et al. |

FOREIGN PATENT DOCUMENTS

| | | |
|---|---|---|
| CN | 101087673 A | 12/2007 |
| CN | 101512761 A | 8/2009 |
| CN | 101681888 A | 3/2010 |
| JP | 2002-254194 A | 9/2002 |
| JP | 2002-254195 A | 9/2002 |
| JP | 2003-094193 A | 4/2003 |
| JP | 2003-211289 A | 7/2003 |
| JP | 2003-332731 A | 11/2003 |
| JP | 2005-288458 A | 10/2005 |
| JP | 2010-149185 A | 7/2010 |
| TW | 1287264 | 3/1994 |
| WO | WO-2006-075459 A1 | 7/2006 |
| WO | WO-2007-125861 A1 | 11/2007 |
| WO | WO-2009/051181 A1 | 4/2009 |

* cited by examiner

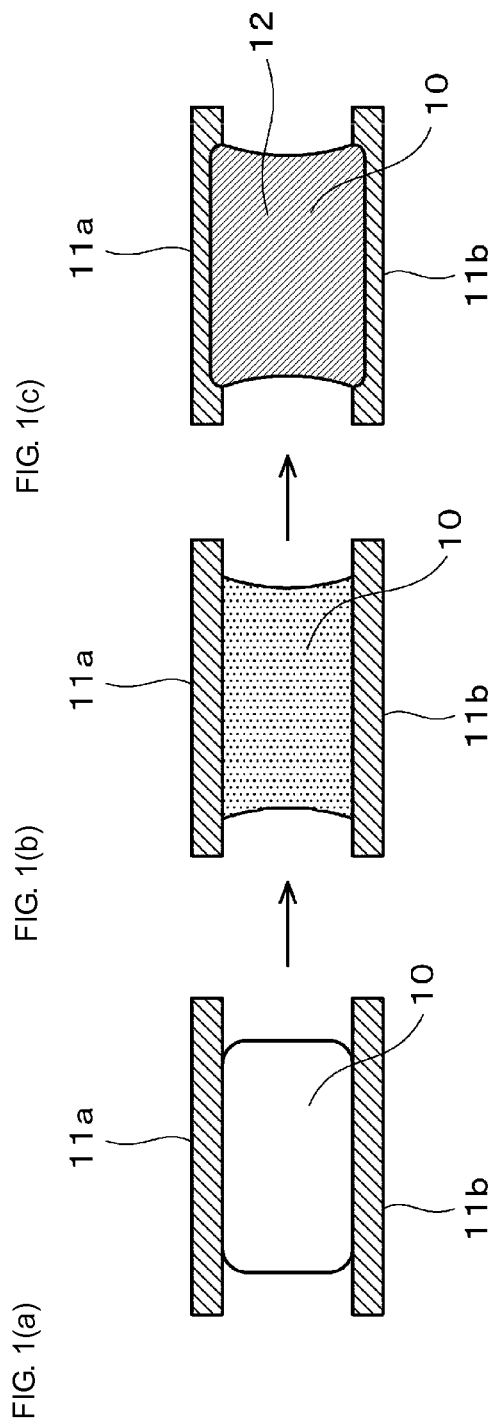

US 9,614,295 B2

JOINING METHOD, JOINT STRUCTURE, ELECTRONIC DEVICE, METHOD FOR MANUFACTURING ELECTRONIC DEVICE AND ELECTRONIC PART

CROSS REFERENCE TO RELATED APPLICATIONS

The present application is a divisional of application Ser. No. 13/904,072, filed May 29, 2013, which is a continuation of International application No. PCT/JP2011/079781, filed Dec. 22, 2011, which claims priority to Japanese Patent Application Nos. 2010-287782, filed Dec. 24, 2010, and 2011-159922, filed Jul. 21, 2011, the entire contents of each of which are incorporated herein by reference.

FIELD OF THE INVENTION

The present invention relates to a joining method, a joint structure, an electronic device, a method for manufacturing an electronic device, and an electronic part, and more particularly to a joining method which is used in mounting, for example, an electronic part, a joint structure, an electronic device, a method for manufacturing an electronic device, and an electronic part.

BACKGROUND OF THE INVENTION

A joining method using a solder (solder paste) is widely used in mounting an electronic part.

In the Sn—Pb solder previously widely used, a bonding method with temperature hierarchy is widely applied, in which soldering is performed at a temperature of 330 to 350° C. by using Pb-rich Pb-5Sn (melting point: 314 to 310° C.) or Pb-10Sn (melting point: 302 to 275° C.) as high temperature solder, for example, and then soldering is performed at a temperature equal to or lower than the melting point of the high temperature solder by using eutectic Sn-37Pb (melting point: 183° C.) of low temperature solder, for example, and thereby, a connection by soldering is performed without melting the high temperature solder used in previous soldering.

Such a bonding method with temperature hierarchy is applied to a semiconductor device of a type in which a chip is die bonded or a semiconductor device which is subjected to flip-chip bonding, and it is an important technique used for the case where connection by soldering is performed in a semiconductor device, and then the semiconductor device itself is connected to a substrate by soldering.

As a solder paste used for this use, for example, a solder paste including a mixture of (a) second metals such as Cu, Al, Au and Ag, or a second metal (or alloy) ball made of a high melting point alloy containing the second metal and (b) a first metal ball made of Sn or In is proposed (see Patent Document 1).

Further, in Patent Document 1, a joining method using a solder paste and a method for manufacturing electronic equipment are disclosed.

When soldering is performed by using the solder paste described in Patent Document 1, as shown schematically in FIG. 2(a), a solder paste including low melting point metal (for example, Sn) balls 51, high melting point metal (for example, Cu) balls 52 and a flux 53 reacts by heating, and after soldering, as shown in FIG. 2(b), a plurality of high melting point metal balls 52 are connected to one another with an intermetallic compound 54, which a low melting point metal derived from the low melting point metal ball forms with a high melting point metal derived from the high melting point metal ball, interposed therebetween, and objects to be joined are connected (soldered) to each other by this connected body.

However, in the case of the joining method of Patent Document 1 in which a solder paste is used, an intermetallic compound of the high melting point metal (for example, Cu) and the low melting point metal (for example, Sn) is produced by heating the solder paste in a soldering step, and when a combination of Cu (high melting point metal) and Sn (low melting point metal) is employed, the low melting point metal, Sn, remains since its diffusing rate is low. When Sn remains, joint strength under an elevated temperature is significantly deteriorated, and there may be cases where a product to be joined cannot be used depending on the type thereof. Further, there is a possibility that Sn remaining after the step of soldering may be melted and flown out in a subsequent step of soldering, and there is a problem that this solder is low in reliability as high temperature solder to be used for a bonding method with temperature hierarchy.

That is, for example, in a manufacturing process of a semiconductor device, when a semiconductor device is manufactured after undergoing a step of soldering and then the semiconductor device is to be mounted on a substrate by a reflow soldering method, there is a possibility that Sn remaining after the step of soldering in the manufacturing process of a semiconductor device is melted and flown out in a step of reflow soldering.

Further, it is necessary to heat the solder paste at a high temperature for a long time in the soldering step in order to convert the low melting point metal completely to the intermetallic compound so that no Sn may remain, but actually this heating is practically impossible in consideration of a balance with productivity.

Moreover, when the solder paste described in Patent Document 1 is used, as shown in FIG. 3, a laminer intermetallic compound 64 such as $Cu_3Sn$ or $Cu_6Sn_5$ is formed at an interface between objects to be joined 61, 62 after reflow and a joining material (solder) 63. If such a laminar intermetallic compound 64 is formed, joint strength at the interface is deteriorated through production of cracks or the like because stress is concentrated at the interface.

Patent Document 1: Japanese Patent Laid-open Publication No. 2002-254194

SUMMARY OF THE INVENTION

The present invention was made to solve the above-mentioned problems, and it is an object of the present invention to provide a joining method, a joint structure, an electronic device, a method for manufacturing an electronic device and an electronic part with which a first metal member can be joined to a second metal member while securing sufficient joint strength, and flow out of a joining material at a second reflow stage in bonding with temperature hierarchy can be inhibited/prevented.

In order to solve the above-mentioned problems, a joining method of the present invention includes the steps of locating a joining material including a low melting point metal having a lower melting point than a first metal and/or a second metal between a first metal member having at least a surface made of the first metal and a second metal member having at least a surface made of the second metal, and heating the joining material at a temperature equal to or higher than the melting point of the low melting point metal, and is characterized in that in the step of heating the joining material, an intermetallic compound is produced by a reaction of the low melting point metal with the first metal and/or the second metal, and the reaction is repeated while the intermetallic compound is peeled/dispersed in the melted low melting point metal.

In the above-mentioned joining method, it is preferred to convert the entire low melting point metal to an intermetallic compound in the step of heating the joining material.

Further, a method for manufacturing an electronic device of the present invention is a method for manufacturing an electronic device including a first metal member having at least a surface made of a first metal and a second metal member having at least a surface made of a second metal, including the step of joining the first metal member to the second metal member by the joining method.

Further, a joining method of the present invention is a joining method for joining a first metal member having at least a surface made of a first metal to a second metal member having at least a surface made of a second metal with a joining material predominantly made of a low melting point metal having a lower melting point than the first metal and/or the second metal sandwiched between the first metal member and the second metal member, wherein the low melting point metal composing the joining material is Sn or an alloy containing Sn in an amount of 70% by weight or more, at least one of the first metal and the second metal is a metal or an alloy which forms an intermetallic compound with the low melting point metal composing the joining material, and which has a lattice constant difference of 50% or more from the intermetallic compound produced on the surface of at least one of the first metal and the second metal, and the joining method includes a heat treatment step of heat-treating the joining material located between the first metal member and the second metal member at a temperature at which the low melting point metal composing the joining material is melted to join the first metal member to the second metal member with the joining material sandwiched therebetween.

In the joining method of the present invention, the low melting point metal is preferably Sn or an alloy containing Sn in an amount of 85% by weight or more.

Further, in the joining method of the present invention, it is preferred that the heat treatment step is performed in a state where the proportion of (b) one, of the first metal and the second metal, having the lattice constant difference of 50% or more in the total amount of (a) the low melting point metal composing the joining material and (b) is 30% by volume or more.

In the joining method of the present invention, it is preferred that the low melting point metal composing the joining material is Sn alone or an alloy containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te and P.

At least one of the first metal and the second metal is preferably a Cu—Mn alloy or a Cu—Ni alloy.

Further, at least one of the first metal and the second metal is preferably a Cu—Mn alloy containing Mn in the proportion of 5 to 30% by weight or a Cu—Ni alloy containing Ni in the proportion of 5 to 30% by weight, and particularly preferably a Cu—Mn alloy containing Mn in the proportion of 10 to 15% by weight or a Cu—Ni alloy containing Ni in the proportion of 10 to 15% by weight.

Further, a method for manufacturing an electronic device of the present invention is a method for manufacturing an electronic device including a first metal member having at least a surface made of a first metal and a second metal member having at least a surface made of a second metal, including the step of joining the first metal member to the second metal member by the joining method.

A joint structure of the present invention is a joint structure in which a first metal member is joined to a second metal member with a joint portion sandwiched therebetween, wherein a Cu-M-Sn (M is Ni and/or Mn) intermetallic compound is dispersed in the joint portion, and neither a $Cu_3Sn$ layer nor a $Cu_6Sn_5$ layer, which is an intermetallic compound layer, is formed on at least one of interfaces with the first metal member and the second metal member.

In addition, in the joint structure of the present invention, it is preferred that the intermetallic compound layer is not formed on both the interface with the first metal member and the interface with the second metal member in the joint portion.

An electronic device of the present invention is an electronic device in which a first metal member having at least a surface made of a first metal is joined to a second metal member having at least a surface made of a second metal with a joint portion sandwiched therebetween.

Further, an electronic part of the present invention is an electronic part including an electrode to be subjected to joining by a joining material including a low melting point metal of Sn or an alloy containing Sn in an amount of 70% by weight or more, wherein the surface of the electrode in contact with the joining material is formed of a metal or an alloy which forms an intermetallic compound with the low melting point metal, and which has a lattice constant difference of 50% or more from the intermetallic compound produced on the surface of the electrode by a reaction of the surface of the electrode with the low melting point metal.

In the electronic part of the present invention, the surface of the electrode in contact with the joining material is preferably formed of a Cu—Mn alloy or a Cu—Ni alloy.

Particularly, the Cu—Mn alloy or the Cu—Ni alloy is preferably a Cu—Mn alloy containing Mn in the proportion of 5 to 30% by weight or a Cu—Ni alloy containing Ni in the proportion of 5 to 30% by weight, and moreover preferably a Cu—Mn alloy containing Mn in the proportion of 10 to 15% by weight or a Cu—Ni alloy containing Ni in the proportion of 10 to 15% by weight.

In the joining method of the present invention, a joining material including a low melting point metal having a lower melting point than a first metal and/or a second metal is located between a first metal member having at least a surface made of the first metal and a second metal member having at least a surface made of the second metal, and the joining material is heated at a temperature equal to or higher than the melting point of the low melting point metal, and in the step of heating the joining material, by a reaction of the low melting point metal with the first metal and/or the second metal, an intermetallic compound is produced and the reaction is repeated while the intermetallic compound is peeled/dispersed in the melted low melting point metal. Consequently, the interdiffusion between the first metal and/or the second metal and the low melting point metal outstandingly proceeds to promote the conversion to an intermetallic compound having a higher melting point, and therefore it becomes possible to perform joining with large strength in high temperature, adequate joint strength and impact resistance.

Further, by converting the entire low melting point metal to an intermetallic compound in the step of heating the joining material, it becomes possible to perform joining with larger strength in high temperature, adequate joint strength and impact resistance.

Further, the method for manufacturing an electronic part of the present invention can efficiently manufacture a highly reliable electronic part in which the first metal member is surely joined to the second metal member with the joining material sandwiched therebetween since the method includes the step of joining the first metal member to the second metal member by the joining method.

In the joining method of the present invention, it is possible to inhibit/prevent remelting of the joining material also in reflowing a joined body obtained by joining by the method of the present invention secondly, and to improve joint strength and impact resistance since, in joining the first metal member having at least a surface made of a first metal to the second metal member having at least a surface made of a second metal with the joining material predominantly made of a low melting point metal having a lower melting point than the first metal and/or the second metal sandwiched between the first metal member and the second metal member, the low melting point metal composing the joining material is Sn or an alloy containing Sn in an amount of 70% by weight or more, and at least one of the first metal and the second metal is a metal or an alloy which forms an intermetallic compound with the low melting point metal composing the joining material, and which has a lattice constant difference of 50% or more from the intermetallic compound produced on the surface of at least one of the first metal and the second metal.

That is, in accordance with the present invention, since a metal or an alloy is used, which forms an intermetallic compound with the low melting point metal and has a lattice constant difference of 50% or more from the intermetallic compound produced on the surface of at least one of the first metal and the second metal for at least one of the first metal and the second metal, the interdiffusion between the first metal and/or the second metal and the low melting point metal outstandingly proceeds to promote the conversion to an intermetallic compound having a higher melting point, and therefore it becomes possible to perform joining with large strength in high temperature, adequate joint strength and impact resistance.

In addition, in the present invention, the "lattice constant difference" is defined as a value (%) determined by subtracting the lattice constant of the first metal or the second metal from the lattice constant of the intermetallic compound of the first metal or the second metal and the low melting point metal and dividing the obtained value by the lattice constant of the first metal or the second metal, followed by multiplying an absolute value of the obtained value by 100.

That is, the lattice constant difference shows how large a difference there is between the lattice constant of an intermetallic compound newly produced at the interface with the first metal and/or the second metal and the lattice constant of the first metal and/or the second metal, and it does not matter which lattice constant is greater.

The lattice constant difference is expressed by the following formula (1):

Lattice constant difference (%)={(Lattice constant of intermetallic compound−Lattice constant of first metal or second metal)/Lattice constant of first metal or second metal}×100.

Further, in the joining method of the present invention, joining of the first metal member to the second metal member is performed by heat-treating the joining material located between the first metal member and the second metal member at a temperature at which the low melting point metal composing the joining material is melted, and examples of a specific state where such joining (heat-treatment) is performed include 1) a state where the first metal and the second metal are metal materials composing the first metal member (electrode body) and the second metal member (electrode body) to be joined to each other, respectively, at least one of the first metal and the second metal is a metal material having a lattice constant difference of 50% or more from the intermetallic compound, and the low melting point metal is supplied between the first metal member and the second metal member as a solder paste or plate-like solder, and 2) a state where the first metal and the second metal are metal materials composing plating films formed on the surfaces of the first metal member (electrode body) and the second metal member (electrode body) to be joined to each other, respectively, at least one of the first metal and the second metal is a metal material having a lattice constant difference of 50% or more from the intermetallic compound, and the low melting point metal is supplied between the surfaces of the first metal member and the second metal member respectively provided with the plating film as a solder paste or plate-like solder.

Further, in the joining method of the present invention, when the heat treatment step is performed in a state where the proportion of (b) one, of the first metal and the second metal, having the lattice constant difference of 50% or more in the total amount of (a) the low melting point metal composing the joining material and (b) is 30% by volume or more, since the diffusion of one having the lattice constant difference of 50% or more of the first metal and the second metal into the low melting point material composing the joining material adequately proceeds to promote the conversion to an intermetallic compound having a higher melting point, resulting in a very small amount of remaining low melting point metal component, it becomes possible to perform joining with larger strength in high temperature.

Further, a "state where the proportion of (b) one, of the first metal and the second metal, having the lattice constant difference of 50% or more . . . is 30% by volume or more" refers to a state represented by the following formula (2), for example, when both of the first metal and the second metal have a lattice constant difference of 50% or more.

[(first metal+second metal)/{low melting point metal+(first metal+second metal)}]×100≥30(% by volume)  (2)

In the joining method of the present invention, when the low melting point metal composing the joining material is Sn alone or an alloy containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te and P, it is possible that the low melting point metal easily forms an intermetallic compound with at least one of the first metal and the second metal having a lattice constant difference of 50% or more from the low melting point metal.

When at least one of the first metal and the second metal is a Cu—Mn alloy or a Cu—Ni alloy, it is possible that the metal forms an intermetallic compound with the low melting point metal at a lower temperature and in a shorter time, and it is possible to prevent the metal from melting also in a subsequent reflow step.

Further, when at least one of the first metal and the second metal is a Cu—Mn alloy containing Mn in the proportion of 3 to 30% by weight, particularly a Cu—Mn alloy containing Mn in the proportion of 10 to 15% by weight or a Cu—Ni alloy containing Ni in the proportion of 5 to 30% by weight, particularly a Cu—Ni alloy containing Ni in the proportion of 10 to 15% by weight, it is possible that the metal forms an intermetallic compound more reliably with the low melting point metal at a low temperature and in a shorter time, and the present invention can be made more effective.

In manufacturing an electronic device including a first metal member having at least a surface made of a first metal and a second metal member having at least a surface made of a second metal, it is possible to manufacture efficiently a highly reliable electronic device in which the first metal member is surely joined to the second metal member with the joining material sandwiched therebetween by joining the first metal member to the second metal member by the above-mentioned joining method.

Further, in the joint structure of the present invention, since at least a Cu-M-Sn (M is nickel and/or Mn) intermetallic compound is dispersed in the joint portion where the first metal member is joined to the second metal member and the ratio of an unreacted Sn component not converted to an intermetallic compound to the whole joining material is 30% by weight or less, the joint structure has excellent strength in high temperature to avoid the joining material from remelting and flowing out in the step of second reflow or the like, and can increase joint strength between the first metal member and the second metal member.

Further, a laminar intermetallic compound (an intermetallic compound layer) is not formed on at least one of interfaces with the first metal member and the second metal member in the joint portion. Therefore, the joint structure of the present invention can provide a highly reliable joint structure in which cracks or the like resulting from the concentration of stress such as thermal stress are hardly produced, and joint strength between the first metal member and the second metal member against thermal shock is large.

In addition, it is possible to provide a joint structure with higher reliability by configuring a structure in which both of a $Cu_3Sn$ layer and a $Cu_6Sn_5$ layer, the intermetallic compound layers, are not formed on the interface with the first metal member and the interface with the second metal member in the joint portion.

It is also possible to provide an electronic device in which a joint portion between a first metal member and a second metal member has large strength in high temperature, adequate joint strength and impact resistance since the electronic device of the present invention is an electronic device in which the first metal member having at least a surface made of a first metal is joined to the second metal member having at least a surface made of a second metal with the joint portion sandwiched therebetween, and the joint portion where the first metal member is joined to the second metal member is adapted to have the joint structure.

It is also possible to provide an electronic part suitable for being subjected to the joining method of the present invention since the electronic part of the present invention is an electronic part including an electrode to be subjected to joining by a joining material including a low melting point metal of Sn or an alloy containing Sn in an amount of 70% by weight or more, and the surface of the electrode in contact with the joining material is formed of a metal or an alloy which forms an intermetallic compound with the low melting point metal, and which has a lattice constant difference of 50% or more from the intermetallic compound produced on the surface of the electrode by a reaction of the surface of the electrode with the low melting point metal.

BRIEF EXPLANATION OF THE DRAWINGS

FIGS. 1(a), 1(b) and 1(c) are drawings schematically showing a behavior in joining by a joining method of an example of the present invention, wherein FIG. 1(a) is a drawing showing a state before heating, FIG. 1(b) is a drawing showing a state where heating is initiated and a joining material is melted, and FIG. 1(c) is a drawing showing a state where heating is continued and an intermetallic compound of a low melting point metal composing the joining material and at least one of a first metal member and a second metal member is formed.

FIGS. 2(a) and 2(b) are drawings showing a behavior of solder in soldering by using a conventional solder paste, wherein FIG. 2(a) is a view showing a state before heating and FIG. 2(b) is a view showing a state after the completion of a soldering step.

DETAILED DESCRIPTION OF THE INVENTION

Figure 2A:
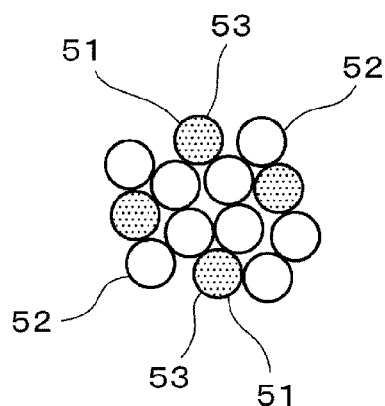
Figure 2B:
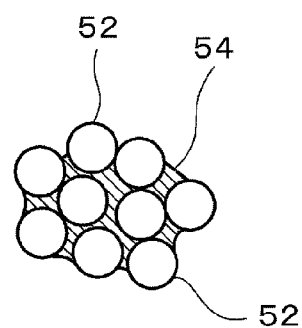
Figure 3:
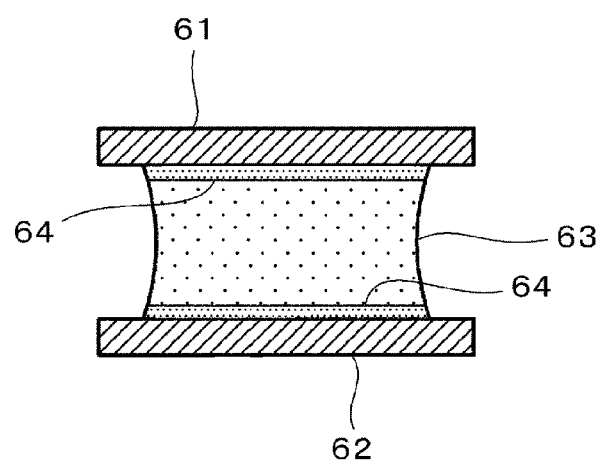
FIG. 3 is a drawing showing a joint structure in which a laminar intermetallic compound is formed on an interface in joining by using a conventional solder paste.

Examples of the present invention will be shown below, and characteristics of the present invention will be described in more detail.

Example 1

In this example, as shown in FIG. 1(a) to FIG. 1(c), a first metal member 11a made of a first metal was joined to a second metal member 11b made of a second metal by using a joining material 10 predominantly made of a low melting point metal having a lower melting point than the first metal and the second metal.

In this example, as the low melting point metal composing the joining material, as shown in Table 1A and Table 1B, Sn-3Ag-0.5Cu, Sn, Sn-3.5Ag, Sn-0.75Cu, Sn-0.7Cu-0.05Ni, Sn-5Sb, Sn-2Ag-0.5Cu-2Bi, Sn-57Bi-1Ag, Sn-3.5Ag-0.5Bi-8In, Sn-9Zn, Sn-8Zn-3Bi, Sn-10Bi, Sn-20Bi, Sn-30Bi, or Sn-40Bi was used.

In the above expression of the low melting point metal composing the joining material, for example, "Sn-3Ag-0.5Cu" represents an alloy (Sn alloy) in which the low melting point metal material contains Ag in an amount of 3% by weight and Cu in an amount of 0.5% by weight and the rest is Sn. Therefore, Sn-40Bi among the above-mentioned low melting point materials is a material of a comparative example which does not meet the requirement of the present invention that "Sn or an alloy containing Sn in an amount of 70% by weight or more".

As the first metal member and the second metal member, as shown in Table 1A and Table 1B, a metal member made of Cu-10Ni, Cu-10Mn, Cu-12Mn-4Ni, Cu-10Mn-1P, Cu or Cu-10Zn was used.

In the sample Nos. 16 and 17 in Table 1B, different materials were used for the first metal material and the second metal material. That is, in the sample No. 16, Cu-10Ni was used for the first metal material (upper metal material) and Cu-10Mn was used for the second metal member (lower metal member), and in the sample No. 17, Cu was used for the first metal member (upper metal member) and Cu-10Mn was used for the second metal member (lower metal member).

In this example, in joining the first metal member and the second metal member described above to each other with a joining material predominantly made of the low melting point metal, a joining material shaped into a plate was located between the first metal member and the second metal member and reflowed at 250° C. for 30 minutes under a load to join the first metal member to the second metal member.

Here, in reference to FIG. 1(a) to FIG. 1(c), a joining method in this example will be described below.

First, as shown FIG. 1(a), a joining material 10 shaped into a plate is positioned between a first metal member 11a and a second metal member 11b.

Next, in this state, the joining material is reflowed at 250° C. for 15 minutes under a load to melt the low melting point metal (Sn or a Sn alloy) composing the joining material 10, as shown in FIG. 1(b). Then, by further keeping on heating for a predetermine time (15 minutes) (that is, by reflowing at 250° C. for 30 minutes), the low melting point metal composing the joining material 10 is melted and reacted with the first metal and/or the second metal respectively composing the first metal member 11a and the second metal member 11b to produce an intermetallic compound 12 (FIG. 1(c)).

Thereby, a joined body in which the first metal member is joined to the second metal member by the joining material containing an intermetallic compound solidified after the reflow is obtained.

It was confirmed that a Cu-M-Sn (M is nickel and/or Mn) intermetallic compound exists in a state of being dispersed in the joining material in accordance with the joining method of the present invention.

[Evaluation of Characteristics]

The joined bodies thus obtained were used as samples, and their characteristics were measured and evaluated by the following methods.

<Joint Strength>

With respect to the joint strength, shear strength of the obtained joined body was measured by using a bonding tester and evaluated.

Measurement of the shear strength was carried out at a lateral push rate of 0.1 mm/s$^{-1}$ under conditions of room temperature and 260° C.

A sample having a shear strength of 20 Nmm$^{-2}$ or more was rated as "⊙" (excellent), and a sample having a shear strength of 2 Nmm$^{-2}$ or less was rated as "x" (defective).

The measured joint strength (room temperature, 260° C.) of the samples and the results of evaluation are collectively shown in Table 1A and Table 1B.

<Evaluation of Remaining Component>

A portion of about 7 mg of the joining material (reaction product) containing an intermetallic compound solidified after the reflow was cut off, and analyzed at a temperature rise rate of 5° C./min at a measurement temperature of 30° C. to 300° C. in a nitrogen atmosphere using $Al_2O_3$ as a reference by using differential scanning calorimetry (DSC). The amount of the remaining low melting point metal component was quantified from an endothermic quantity of an endothermic melting peak at a melting temperature of the low melting point metal component in the resulting DSC chart and the content (% by volume) of the remaining low melting point metal was determined. The case where the content of the remaining low melting point metal was 0 to 3% by volume was rated as "⊙" (excellent), the case where it was more than 3% by volume and 30% by volume or less was rated as "○" (good), and the case where it was more than 30% by volume was rated as "x" (defective).

The content of the remaining low melting point metal and the results of evaluation are collectively shown in Table 1A and Table 1B.

<Flow Out Percent Defective (%)>

The obtained joined bodies were sealed with an epoxy resin, left standing in an environment of 85% in relative humidity, and heated in the reflow condition of a peak temperature of 260° C. to determine an incidence rate of flow out defective in which the joining material was remelted and flown out. The flow out percent defective was determined from this result and evaluated.

The case where the flow out percent defective of the joining material was 0 to 10% was rated as "⊙" (excellent), the case where it was more than 10% and 50% or less was rated as "○" (good), and the case where it was more than 50% was rated as "x" (defective).

The flow out percent defective and the results of evaluation are collectively shown in Table 1A and Table 1B.

<Existence or Non-Existence of Cracks and Joint Strength after Thermal Shock Test>

The obtained joined bodies (samples) were subjected to a test in which a cycle of respectively holding a sample for 30 minutes under the temperature conditions of −40° C. and +85° C. is repeated a thousand times, and then production of cracks of each sample was observed. Then, the existence or non-existence of production of cracks was evaluated.

Further, the joint strength of the samples after the thermal shock test was evaluated in the same way as in the above test. A sample having a shear strength of 20 Nmm$^{-2}$ or more was rated as "⊙" (excellent), a sample having a shear strength of 10 Nmm$^{-2}$ or more and less than 20 Nmm$^{-2}$ was rated as "○" (good), and a sample having a shear strength of less than 10 Nmm$^{-2}$ was rated as "x" (defective).

The existence or non-existence of cracks and joint strength after the thermal shock test and the results of evaluation are collectively shown in Table 1A and Table 1B. The production of cracks was evaluated not because the crack itself is problematic but because it is a factor for deteriorating the joint strength.

In Table 1A and Table 1B, the following items are shown:

type (composition) of the low melting point metal composing the joining material, composition and the lattice constant of metals (a first metal and a second metal) composing the first metal member and the second metal member (in Tables 1A and 1B, the first metal and the second metal are the same metal in the sample Nos. 1 to 15 and different metals in the sample Nos. 16 and 17), type and the lattice constant of an intermetallic compound produced by the reaction of the low melting point metal composing the joining material with the first metal and/or the second metal (in examples, the lattice constant was evaluated based on a axis), lattice constant difference which is a difference between the lattice constant of the intermetallic compound and the lattice constant of the first metal and/or the second metal, and existence or non-existence of a laminar intermetallic compound such as $Cu_3Sn$ and $Cu_6Sn_5$ formed on the interface between the first metal member and/or the second metal member made of a metal having a lattice constant difference of 50% or more from the intermetallic compound and the joint portion (joining material including an intermetallic compound) which is solidified after reflow and joins the first metal member to the second metal member in the joint portion.

TABLE 1A

| Sample No. | Low Melting Point Metal Composing Joining Material | Composition and Lattice Constant of First Metal and Second Metal | | Composition of Intermetallic Compound Produced | | Lattice Constant Difference (%) | Existence or Non-existence of Laminar Intermetallic Compound | Joint Strength and Evaluation (Room Temperature) | |
|---|---|---|---|---|---|---|---|---|---|
| | | Composition | Lattice Constant a (nm) | Composition | Lattice Constant a (nm) | | | Joint Strength (Nmm$^{-2}$) | Evaluation |
| 1 | Sn—3Ag—0.5Cu | Cu—10Ni | 0.357 | Cu$_2$NiSn | 0.597 | 67 | None | 28 | ◉ |
| 2 | Sn—3Ag—0.5Cu | Cu—10Mn | 0.367 | Cu$_2$MnSn | 0.617 | 68 | None | 28 | ◉ |
| 3 | Sn | Cu—10Mn | 0.367 | Cu$_2$MnSn | 0.617 | 68 | None | 29 | ◉ |
| 4 | Sn—3.5Ag | Cu—10Mn | 0.367 | Cu$_2$MnSn | 0.617 | 68 | None | 27 | ◉ |
| 5 | Sn—0.75Cu | Cu—10Mn | 0.367 | Cu$_2$MnSn | 0.617 | 68 | None | 27 | ◉ |
| 6 | Sn—15Bi | Cu—10Mn | 0.367 | Cu$_2$MnSn | 0.617 | 68 | None | 27 | ◉ |
| 7 | Sn—0.7Cu—0.05Ni | Cu—10Mn | 0.367 | Cu$_2$MnSn | 0.617 | 68 | None | 28 | ◉ |
| 8 | Sn—5Sb | Cu—10Mn | 0.367 | Cu$_2$MnSn | 0.617 | 68 | None | 30 | ◉ |
| 9 | Sn—2Ag—0.5Cu—2Bi | Cu—10Mn | 0.367 | Cu$_2$MnSn | 0.617 | 68 | None | 29 | ◉ |
| 10 | Sn—30Bi | Cu—10Mn | 0.367 | Cu$_2$MnSn | 0.617 | 68 | None | 29 | ◉ |

| Sample No. | Joint Strength and Evaluation (260° C.) | | Flow Out Percent Defective and Content of Remaining Low Melting Point Metal and Evaluation | | Evaluation Flow Out Percent Defective (%) | | Thermal Shock Test and Evaluation | | |
|---|---|---|---|---|---|---|---|---|---|
| | Joint Strength (Nmm$^{-2}$) | Evaluation | Content (%) | Evaluation | Defective (%) | Evaluation | Existence or Non-existence of Crack Production | Joint Strength (Nmm$^{-2}$) | Evaluation |
| 1 | 25 | ◉ | 0 | ◉ | 0 | ◉ | None | 26 | ◉ |
| 2 | 24 | ◉ | 0 | ◉ | 0 | ◉ | None | 25 | ◉ |
| 3 | 24 | ◉ | 0 | ◉ | 0 | ◉ | None | 26 | ◉ |
| 4 | 22 | ◉ | 0 | ◉ | 0 | ◉ | None | 26 | ◉ |
| 5 | 24 | ◉ | 0 | ◉ | 0 | ◉ | None | 25 | ◉ |
| 6 | 26 | ◉ | 0 | ◉ | 0 | ◉ | None | 24 | ◉ |
| 7 | 24 | ◉ | 0 | ◉ | 0 | ◉ | None | 26 | ◉ |
| 8 | 26 | ◉ | 0 | ◉ | 0 | ◉ | None | 28 | ◉ |
| 9 | 26 | ◉ | 0 | ◉ | 0 | ◉ | None | 25 | ◉ |
| 10 | 25 | ◉ | 15 | ○ | 20 | ○ | Slightly existed | 17 | ○ |

TABLE 1B

| Sample No. | Low Melting Point Metal Composing Joining Material | Composition and Lattice Constant of First Metal and Second Metal | | Composition of Intermetallic Compound Produced | | Lattice Constant Difference (%) | Existence or Non-existence of Laminar Intermetallic Compound | Joint Strength and Evaluation (Room Temperature) | |
|---|---|---|---|---|---|---|---|---|---|
| | | Composition | Lattice Constant a (nm) | Composition | Lattice Constant a (nm) | | | Joint Strength (Nmm$^{-2}$) | Evaluation |
| 11 | Sn—3.5Ag—0.5Bi—8In | Cu—10Mn | 0.367 | Cu$_2$MnSn | 0.617 | 68 | None | 28 | ◉ |
| 12 | Sn—9Zn | Cu—10Mn | 0.367 | Cu$_2$MnSn | 0.617 | 68 | None | 27 | ◉ |
| 13 | Sn—8Zn—3Bi | Cu—10Mn | 0.367 | Cu$_2$MnSn | 0617 | 68 | None | 27 | ◉ |
| 14 | Sn—3Ag—0.5Cu | Cu—12Mn—4Ni | 0.367 | Cu$_2$MnSn | 0.617 | 68 | None | 28 | ◉ |
| 15 | Sn—3Ag—0.5Cu | Cu—10Mn—1P | 0.367 | Cu$_2$MnSn | 0.617 | 68 | None | 29 | ◉ |
| 16 | Sn—3Ag—0.5Cu | Cu—10Ni (first) | 0.352 | Cu$_2$NiSn | 0.597 | 67 | None | 28 | ◉ |
| | | Cu—10Mn (second) | 0.367 | Cu$_2$MnSn | 0.617 | 68 | | | |
| 17 | Sn—3Ag—0.5Cu | Cu (first) | 0.361 | Cu$_3$Sn | 0.432 | 20 | Existed (upper side) | 26 | ◉ |
| | | Cu—10Mn (second) | 0.367 | Cu$_2$MnSn | 0.617 | 68 | Did not exist (lower side) | | |
| 18 | Sn—3Ag—0.5Cu | Cu | 0.361 | Cu$_3$Sn | 0.432 | 20 | Existed | 25 | ◉ |
| 19 | Sn—3Ag—0.5Cu | Cu—10Zn | 0.359 | Cu$_3$Sn | 0.432 | 20 | Existed | 31 | ◉ |
| 20 | Sn—40Bi | Cu—10Mn | 0.359 | Cu$_3$Sn | 0.432 | 20 | Existed | 28 | ◉ |

TABLE 1B-continued

| | Joint Strength and Evaluation (260° C.) | | Content of Remaining Low Melting Point Metal and Evaluation | | Flow Out Percent Defective and Evaluation | | Thermal Shock Test and Evaluation | | |
|---|---|---|---|---|---|---|---|---|---|
| Sample No. | Joint Strength (Nmm$^{-2}$) | Evaluation | Content (%) | Evaluation | Flow Out Percent Defective (%) | Evaluation | Existence or Non-existence of Crack Production | Joint Strength (Nmm$^{-2}$) | Evaluation |
| 11 | 24 | ◉ | 0 | ◉ | 0 | ◉ | None | 27 | ◉ |
| 12 | 25 | ◉ | 0 | ◉ | 0 | ◉ | None | 26 | ◉ |
| 13 | 24 | ◉ | 0 | ◉ | 0 | ◉ | None | 23 | ◉ |
| 14 | 23 | ◉ | 0 | ◉ | 0 | ◉ | None | 25 | ◉ |
| 15 | 23 | ◉ | 0 | ◉ | 0 | ◉ | None | 24 | ◉ |
| 16 | 25 | ◉ | 0 | ◉ | 0 | ◉ | None | 24 | ◉ |
| 17 | 24 | ◉ | 0 | ◉ | 0 | ◉ | Existed only on upper side | 15 | ○ |
| 18 | 0.1 | X | 31 | X | 75 | X | Existed | 5 | X |
| 19 | 1.8 | X | 34 | X | 70 | X | Existed | 7 | X |
| 20 | 2.0 | X | 32 | X | 71 | X | Existed | 8 | X |

As shown in Table 1A and Table 1B, with respect to the joint strength at room temperature, both of samples of examples of sample Nos. 1 to 17 which meet the requirements of the present invention and samples of comparative examples of sample Nos. 18 to 20 which do not meet the requirements of the present invention exhibited a joint strength of 20 Nmm$^{-2}$ or more, and were found to have practical strength.

On the other hand, with respect to the joint strength at 260° C., while the samples of comparative examples of sample Nos. 18 to 20 exhibited insufficient joint strength of 2 Nmm$^{-2}$ or less, the samples of examples of sample Nos. 1 to 17 had a joint strength of 10 Nmm$^{-2}$ or more, and were found to have practical strength.

Further, with respect to the content of the remaining low melting point metal (remaining component evaluation), it was found that in the samples of comparative examples of sample Nos. 18 to 20, the content of the remaining low melting point metal was larger than 30% by volume, and on the other hand, in all of the samples of examples of sample Nos. 1 to 17, the content of the remaining low melting point metal could be made 30% by volume or less, and particularly in all of the samples of examples of sample Nos. 1 to 9 and 11 to 17 in which Sn or an alloy containing Sn in an amount of 85% by weight or more was used as a low melting point metal, the content of the remaining low melting point metal was 0% by volume.

Further, with respect to the flow out percent defective of the joining material, it was found that in the samples of comparative examples of sample Nos. 18 to 20, the flow out percent defective was 70% or more, and on the other hand, in all of the samples of examples of sample Nos. 1 to 17, the flow out percent defective was 20% or less, and particularly all of the samples of examples of sample Nos. 1 to 9 and 11 to 17, in which Sn or an alloy containing Sn in an amount of 85% by weight or more was used as a low melting point metal, had high heat resistance as the flow out percent defective was 0%.

It was found that the samples of examples of sample Nos. 1 to 17 had similar high heat resistance irrespective of the type of the low melting point metal.

Further, the samples of examples of sample Nos. 1 to 17 which satisfy the requirements of the present invention include:

samples in which metals composing the first metal member and the second metal member are the same metal and a metal containing Cu—Mn as a base (Cu-12Mn-4Ni, Cu-10Mn-1P, etc.) like the samples of sample Nos. 1 to 15, samples in which the first metal member and the second metal member are respectively made of different metals and both metal members have the above-mentioned lattice constant difference of 50% or more like the sample of sample No. 16, and samples in which the first metal member and the second metal member are respectively made of different metals and one of the metal members has the above-mentioned lattice constant difference of less than 50% like the sample of sample No. 17, and any of these samples was similarly found to have high heat resistance.

Further, in the samples of comparative examples of sample Nos. 18 to 20, production of cracks was found after the 1000 cycle test in the observation of the sample after the thermal shock test. The cracks were produced principally within a Cu$_3$Sn layer and a Cu$_6$Sn$_5$ layer (intermetallic compound layer) formed at an interface between the joining material and the first metal member and/or the second metal member, at an interface between the intermetallic compound layer and the first metal member and/or the second metal member, and at an interface between the intermetallic compound layer and the joining material.

Meanwhile, in the samples of examples of sample Nos. 1 to 9 and 11 to 16, production of cracks was not found. On the other hand, in the sample of the example of sample No. 10, since the content of Sn in the low melting point metal was 70% by weight, an intermetallic compound firstly produced had a low diffusion rate though the intermetallic compound was Cu$_2$MnSn. Thus, an intermetallic compound such as Cu$_6$Sn$_5$ or Cu$_3$Sn, but not a laminar compound, was segregated at a part of the interface between the joining material and the first metal member and/or the second metal member. Consequently, microcracks were produced at the interface after the thermal shock, and therefore joint strength was slightly deteriorated.

In the sample of the example of sample No. 18, a laminar intermetallic compound was formed at an interface between the joining material and the first metal since Cu was used as a first metal. Consequently, cracks were produced only at the interface between the joining material and the first metal, and therefore joint strength was slightly deteriorated.

Consequently, with respect to the thermal shock resistance, in the samples of comparative examples of sample Nos. 18 to 20 which do not meet the requirements of the present invention concerning the lattice constant difference, etc., the joint strength after the thermal shock test was as low as 5 Nmm$^{-2}$ (sample No. 18), 7 Nmm$^{-2}$ (sample No. 19), or 8 Nmm$^{-2}$ (sample No. 20), but in the samples of sample Nos. 1 to 17 which meet the requirements of the present invention, it was found that the joint strength after the thermal shock test was largely improved compared with that in comparative examples.

Specifically, it was found that in the samples of sample Nos. 1 to 9 and 11 to 16, the joint strength after the thermal shock test was 20 Nmm$^{-2}$ or more, that in the sample of sample No. 10 (sample in which the content of Sn in the low melting point metal is 70% by weight), the joint strength after the thermal shock test was 17 Nmm$^{-2}$, and that in the sample of sample No. 17 (sample in which a first metal member (upper metal member) is Cu and a second metal member (lower metal member) is Cu-10Mn), the joint strength after the thermal shock test was 15 Nmm$^{-2}$, and these joint strengths were smaller than those of the samples of sample Nos. 1 to 9 and 11 to 16 but were at an adequately practicable level.

In addition, in the case of the sample of sample No. 17, while Cu composing the first metal member has a lattice constant difference of less than 50% from an upper intermetallic compound, Cu-10Mn composing the lower second metal member is a metal having a lattice constant difference of more than 50% from the intermetallic compound, and therefore Cu-10Mn reacts quickly with Sn or a Sn alloy which is a low melting point metal in the joining material. Therefore, it is thought that the production of the intermetallic compound on the Cu-10Mn side (second metal side) is prevalent, and a laminar intermetallic compound such as Cu$_3$Sn or Cu$_6$Sn$_5$ at the interface on the Cu side (first metal side), even if this layer is produced, is very small in thickness and the effect on the joint strength after the thermal shock test was small.

In addition, it was confirmed that in the joint portion, a laminar intermetallic compound such as Cu$_3$Sn or Cu$_6$Sn$_5$ was not formed on the interface with the second metal member made of a metal (Cu-10Mn) having a lattice constant difference of more than 50% from the intermetallic compound.

Further, in the case of samples of examples of sample Nos. 1 to 17 which meet the requirements of the present invention, since the low melting point metal (Sn or a Sn alloy) did not remain in the joint portion, it is thought that an intermetallic compound layer did not grow, and therefore cracks were not produced to maintain joint strength even when a joined body obtained after reflow was further subjected to the thermal shock test.

The reason why samples of sample Nos. 1 to 17 satisfying the requirements of the present invention have high heat resistance as described above is probably that Cu—Mn and a Cu—Ni alloy respectively having a lattice constant difference of 50% or more from the intermetallic compounds (Cu$_2$MnSn and Cu$_2$NiSn) which Cu—Mn and Cu—Ni form with the low melting point metal composing the joining material are used for at least one of the first metal and the second metal respectively composing the first metal member and the second metal member.

That is, when the intermetallic compound produced has a large lattice constant difference from the first metal composing the first metal member and/or the second metal composing the second metal member, since the reaction is repeated while the intermetallic compound is peeled/dispersed in the melted low melting point metal, it is thought that the production rate of the intermetallic compound outstandingly increases and the laminar intermetallic compound is not formed at the interface.

Example 2

A joining material using Sn as a low melting point metal was used, and a first metal member and a second metal member, respectively made of Cu-10Ni, were joined to each other (samples of sample Nos. 21 to 27 in Table 2).

Similarly, a joining material using Sn as a low melting point metal was used, and a first metal member and a second metal member, respectively made of Cu-10Ni, were joined to each other (samples of sample Nos. 28 to 30 in Table 2).

Thicknesses of the first metal member and the second metal member were set to 0.1 mm.

As the joining material, as shown in Table 2, plate-like joining materials having different thicknesses from 0.266 mm to 1.327 mm were used.

The first metal member was joined to the second metal member under the same conditions as in Example 1 except for the above-mentioned thicknesses.

Then, characteristics of the resulting joined bodies were measured and evaluated in the same way as in Example 1. Specifically, measurement of joint strength, evaluation of the remaining component, evaluation of flow out, and evaluation of existence or non-existence of cracks and measurement of joint strength after a thermal shock test were performed.

In addition, in the evaluation of joint strength in Example 2, a sample having a shear strength of 20 Nmm$^{-2}$ or more was rated as "⊙" (excellent), a sample having a shear strength of 2 Nmm$^{-2}$ or more and less than 20 Nmm$^{-2}$ was rated as "○" (good), and a sample having a shear strength of less than 2 Nmm$^{-2}$ was rated as "x" (defective).

The case where a ratio of the remaining first metal component was 0 to 3% by volume was rated as "⊙" (excellent), the case where it was more than 3% by volume and 30% by volume or less was rated as "○" (good), and the case where it was more than 30% by volume was rated as "x" (defective).

The case where the flow out percent defective of the joining material was 0 to 10% was rated as "⊙" (excellent), the case where it was more than 10% and 50% or less was rated as "○" (good), and the case where it was more than 50% was rated as "x" (defective).

With respect to the existence or non-existence of cracks after a thermal shock test, the existence or non-existence of production of cracks was evaluated.

The joint strength (room temperature, 260° C.), the content of the remaining low melting point metal, the flow out percent defective and the existence or non-existence of cracks and joint strength after a thermal shock test of the joined bodies are shown in Table 2.

In Table 2, "Proportion (%)" in the column "First Metal and Second Metal" represents the proportion of the total thickness (0.2 mm) of the first metal member (Cu-10Mn) and the second metal member (Cu-10Mn) to the combined value (0.466 mm) of the total thickness (in the sample No. 21, 0.1 mm×2=0.2 mm) of the first metal member (Cu-10Mn) and the second metal member (Cu-10Mn) and the thickness (in the sample No. 21, 0.266 mm) of the joining material (Sn).

TABLE 2

| Sample No. | Thickness of Joining Material (Sn) (mm) | First Metal and Second Metal Kind | Thickness (mm) | Proportion (%) | Joint Strength and Evaluation (Room Temperature) Joint Strength (Nmm$^{-2}$) | Evaluation | Joint Strength and Evaluation (260° C.) Joint Strength (Nmm$^{-2}$) | Evaluation |
|---|---|---|---|---|---|---|---|---|
| 21 | 0.266 | Cu—10Mn | 0.1 | 42.9 | 25 | ◉ | 23 | ◉ |
| 22 | 0.404 | Cu—10Mn | 0.1 | 33.1 | 28 | ◉ | 24 | ◉ |
| 23 | 0.467 | Cu—10Mn | 0.1 | 30.0 | 30 | ◉ | 26 | ◉ |
| 24 | 0.533 | Cu—10Mn | 0.1 | 27.1 | 31 | ◉ | 16 | ○ |
| 25 | 0.765 | Cu—10Mn | 0.1 | 20.1 | 29 | ◉ | 11 | ○ |
| 26 | 1.066 | Cu—10Mn | 0.1 | 15.8 | 27 | ◉ | 9 | ○ |
| 27 | 1.327 | Cu—10Mn | 0.1 | 13.1 | 27 | ◉ | 7 | ○ |
| 28 | 0.342 | Cu—10Ni | 0.1 | 36.9 | 30 | ◉ | 27 | ◉ |
| 29 | 0.467 | Cu—10Ni | 0.1 | 30.0 | 33 | ◉ | 29 | ◉ |
| 30 | 1.027 | Cu—10Ni | 0.1 | 16.3 | 27 | ◉ | 8 | ○ |

| Sample No. | Content of Remaining Low Melting Point Metal and Evaluation Content (% by volume) | Evaluation | Flow Out Percent Defective and Evaluation Flow Out Percent Defective (%) | Evaluation | Thermal Shock Test and Evaluation Existence or Non-existence of Crack Production | Joint Strength (Nmm$^{-2}$) | Evaluation |
|---|---|---|---|---|---|---|---|
| 21 | 0 | ◉ | 0 | ◉ | None | 24 | ◉ |
| 22 | 0 | ◉ | 0 | ◉ | None | 26 | ◉ |
| 23 | 0 | ◉ | 0 | ◉ | None | 26 | ◉ |
| 24 | 11 | ○ | 11 | ○ | None | 28 | ◉ |
| 25 | 16 | ○ | 14 | ○ | None | 25 | ◉ |
| 26 | 21 | ○ | 21 | ○ | None | 24 | ◉ |
| 27 | 26 | ○ | 49 | ○ | None | 23 | ◉ |
| 28 | 0 | ◉ | 0 | ◉ | None | 28 | ◉ |
| 29 | 0 | ◉ | 0 | ◉ | None | 28 | ◉ |
| 30 | 23 | ○ | 41 | ○ | None | 24 | ◉ |

As shown in Table 2, with respect to the joint strength at room temperature, all of samples of sample Nos. 21 to 30 exhibited a joint strength of 20 Nmm$^{-2}$ or more, and were found to have adequate joint strength.

Further, with respect to the joint strength at 260° C., each of samples of sample Nos. 21 to 30 has a joint strength of 7 to 26 Nmm$^{-2}$ that is 2 Nmm$^{-2}$ or more, and it was found that practicable joining was performed. Particularly, when the first metal and the second metal were Cu-10Mn, the samples of sample Nos. 21 to 23, 28 and 29, in which the proportion of Cu-10Mn was 30% by volume or more, exhibited a joint strength of 23 Nmm$^{-2}$ or more, and were found to have high strength in high temperature.

Further, with respect to the content of the remaining low melting point metal, it was found that all of the samples of sample Nos. 21 to 30 exhibited a content of the remaining low melting point metal of 30% by volume or less, and particularly in the samples of sample Nos. 21 to 23 in which the proportion of Cu-10Mn is 30% by volume or more and the samples of sample Nos. 28 and 29 in which the proportion of Cu-10Ni is 30% by volume or more, the content of the remaining low melting point metal was 0% by volume.

Further, with respect to the flow out percent defective of the joining material, it was found that all of the samples of sample Nos. 21 to 30 exhibited a flow out percent defective of 50% or less, and particularly in the samples of sample Nos. 21 to 23 in which the proportion of Cu-10Mn is 30% by volume or more and the samples of sample Nos. 28 and 29 in which the proportion of Cu-10Ni is 30% by volume or more, the flow out percent defective was 0% by volume and high heat resistance was obtained.

Example 3

A first metal member and a second metal member, respectively made of metals (Cu—Mn alloys) as shown in sample Nos. 31 to 35 in Table 3, were joined to each other by using a joining material using Sn as a low melting point metal.

A first metal member and a second metal member, respectively made of metals (Cu—Ni alloys) as shown in sample Nos. 36 to 39 in Table 3, were joined to each other by using a joining material using Sn as a low melting point metal.

Thicknesses of the first metal member and the second metal member were set to 0.3 mm.

As the joining material, a plate-like joining material having a thickness of 0.1 mm was used.

The first metal member was joined to the second metal member under the same conditions as in Example 1 except for the above-mentioned thicknesses.

Then, characteristics of the resulting joined body were measured and evaluated in the same way as in Example 1. Specifically, measurement of joint strength, evaluation of the remaining component, evaluation of flow out, and evaluation of existence or non-existence of cracks and measurement of joint strength after a thermal shock test were performed.

In addition, evaluation of joint strength, evaluation of the content of the remaining low melting point metal and evaluation of the flow out percent defective were performed according to the same criteria as in Example 2.

The joint strength (room temperature, 260° C.), the content of the remaining low melting point metal, the flow out percent defective and the existence or non-existence of cracks and joint strength after a thermal shock test of the joined bodies are shown in Table 3.

metal and the second metal were Cu-10Ni and the sample of sample No. 38 in which the first metal and the second metal were Cu-15Ni, the content of the remaining low melting point metal was 0% by volume.

Further, with respect to the flow out percent defective of the joining material, it was found that all of the samples of sample Nos. 31 to 39 exhibited a flow out percent defective

TABLE 3

| Sample No. | Joining Material (0.3 mm) | First Metal and Second Metal (0.1 mm) | Joint Strength and Evaluation (Room Temperature) | | Joint Strength and Evaluation (260° C.) | | Content of Remaining Low Melting Point Metal and Evaluation | |
|---|---|---|---|---|---|---|---|---|
| | | | Joint Strength (Nmm$^{-2}$) | Evaluation | Joint Strength (Nmm$^{-2}$) | Evaluation | Content (% by volume) | Evaluation |
| 31 | Sn | Cu—5Mn | 28 | ◉ | 6 | ○ | 19 | ○ |
| 32 | Sn | Cu—10Mn | 27 | ◉ | 24 | ◉ | 0 | ◉ |
| 33 | Sn | Cu—15Mn | 28 | ◉ | 25 | ◉ | 0 | ◉ |
| 34 | Sn | Cu—20Mn | 30 | ◉ | 12 | ○ | 9 | ○ |
| 35 | Sn | Cu—30Mn | 31 | ◉ | 5 | ○ | 21 | ○ |
| 36 | Sn | Cu—5Ni | 28 | ◉ | 8 | ○ | 12 | ○ |
| 37 | Sn | Cu—10Ni | 30 | ◉ | 26 | ◉ | 0 | ◉ |
| 38 | Sn | Cu—15Ni | 29 | ◉ | 26 | ◉ | 0 | ◉ |
| 39 | Sn | Cu—20Ni | 30 | ◉ | 12 | ○ | 5 | ○ |

| Sample No. | Flow Out Percent Defective and Evaluation | | Thermal Shock Test and Evaluation | | |
|---|---|---|---|---|---|
| | Flow Out Percent Defective (%) | Evaluation | Existence or Non-existence of Crack Production | Joint Strength (Nmm$^{-2}$) | Evaluation |
| 31 | 32 | ○ | None | 24 | ◉ |
| 32 | 0 | ◉ | None | 25 | ◉ |
| 33 | 0 | ◉ | None | 25 | ◉ |
| 34 | 15 | ○ | None | 27 | ◉ |
| 35 | 35 | ○ | None | 27 | ◉ |
| 36 | 26 | ○ | None | 26 | ◉ |
| 37 | 0 | ◉ | None | 26 | ◉ |
| 38 | 0 | ◉ | None | 25 | ◉ |
| 39 | 12 | ○ | None | 27 | ◉ |

As shown in Table 3, with respect to the joint strength at room temperature, all of samples of sample Nos. 31 to 39 exhibited a joint strength of 20 Nmm$^{-2}$ or more, and were found to have adequate joint strength.

Further, with respect to the joint strength at 260° C., each of samples of sample Nos. 31 to 39 was found to have a joint strength of 5 to 26 Nmm$^{-2}$ which is a practicable joint strength of 2 Nmm$^{-2}$ or more.

Particularly, the samples of sample No. 32 in which the first metal and the second metal were Cu-10Mn, the sample of sample No. 33 in which the first metal and the second metal were Cu-15Mn, the sample of sample No. 37 in which the first metal and the second metal were Cu-10Ni, and the sample of sample No. 38 in which the first metal and the second metal were Cu-15Ni exhibited a joint strength of 24 Nmm$^{-2}$ or more, and were found to have high strength in high temperature.

With respect to the content of the remaining low melting point metal, it was found that all of the samples of sample Nos. 31 to 39 exhibited a content of the remaining low melting point metal of 30% by volume or less, and moreover in the sample of sample No. 32 in which the first metal and the second metal were Cu-10Mn, the sample of sample No. 33 in which the first metal and the second metal were Cu-15Mn, the sample of sample No. 37 in which the first metal and the second metal were Cu-10Ni and the sample of sample No. 38 in which the first metal and the second metal were Cu-15Ni, the content of the remaining low melting point metal was 0% by volume.

of 35% or less, and moreover in the sample of sample No. 32 in which the first metal and the second metal were Cu-10Mn, the sample of sample No. 33 in which the first metal and the second metal were Cu-15Mn, the sample of sample No. 37 in which the first metal and the second metal were Cu-10Ni and the sample of sample No. 38 in which the first metal and the second metal were Cu-15Ni, the flow out percent defective was 0% and high heat resistance was obtained.

Example 4

In Examples 1 to 3 described above, the plate-like joining material was used as a joining material containing a low melting point metal, but in Example 4, a solder paste obtained by mixing a flux and a low melting point metal (Sn-3Ag-0.5Cu powder) was used, and a first metal member made of Cu and a second metal member made of Cu-10Mn were joined to each other.

In joining, the above-mentioned solder paste was printed on the first metal member made of Cu, and the second metal member made of Cu-10Mn was overlaid thereon, and then reflowing was performed at 250° C. for 30 minutes to join the first metal member to the second metal member.

Then, characteristics of the resulting joined body were measured and evaluated in the same way as in Example 1.

Specifically, measurement of joint strength, evaluation of the remaining component, evaluation of flow out, and evaluation of existence or non-existence of cracks and measurement of joint strength after a thermal shock test were performed, and characteristics were evaluated.

Consequently, it was found that a joined body having characteristics equal to those of samples of Examples 1 to 3 which meet the requirements of the present invention was obtained.

In examples described above, the present invention has been described taking a case where the whole first metal member is made of the first metal and the whole second metal member is made of the second metal as an example, but it is also possible to employ a constitution in which the first metal and the second metal are metal materials composing plating films formed on the surfaces of the first metal member (electrode body) and the second metal member (electrode body) to be joined to each other, respectively, and at least one of the first metal and the second metal is a metal material having a lattice constant difference of 50% or more from the intermetallic compound.

Example 5 a) In Example 5, a solder paste obtained by mixing a flux and a low melting point metal (Sn-3Ag-0.5Cu powder) was used, and an electronic device having a structure in which a chip capacitor and a surface acoustic wave filter were mounted on a glass epoxy board was manufactured by joining a land electrode (first metal member in the present invention) made of Cu on the glass epoxy board to an external electrode (second metal member in the present invention) made of Cu-10Mn of the chip capacitor (electronic part) and the surface acoustic wave filter (SAW filter) (electronic part).

That is, the electronic device is an electronic device having a structure in which the above first metal member is joined to the above second metal member with a joining material meeting the requirements of the present invention sandwiched therebetween.

In joining the external electrode (second metal member) to the land electrode (first metal member), the above-mentioned solder paste was printed on the first metal member made of Cu of a glass epoxy board, and the external electrode (second metal member) made of Cu-10Mn of the chip capacitor and a SAW filter was overlaid thereon, and then reflowing was performed at 250° C. for 30 minutes to join the first metal member to the second metal member.

The thickness of the first metal member was set to 0.05 mm and the thickness of the second metal member was set to 0.05 mm.

Further, the solder paste was printed on the land electrode by using a metal mask having a thickness of 0.05 mm.

Characteristics of the resulting joined bodies were measured and evaluated in the same way as in Example 1. Specifically, measurement of joint strength, evaluation of the remaining component, evaluation of flow out, and evaluation of existence or non-existence of cracks and measurement of joint strength after a thermal shock test were performed, and characteristics were evaluated.

Evaluation of joint strength, evaluation of the content of the remaining low melting point metal and evaluation of the flow out percent defective were performed according to the same criteria as in Example 2.

The joint strength (room temperature, 260° C.), the content of the remaining low melting point metal, the flow out percent defective and the existence or non-existence of cracks and joint strength after a thermal shock test of the joined bodies are shown in Table 4.

TABLE 4

| Low Melting Point Metal Composing Joining Material | First Metal and Second Metal | | Joint Strength and Evaluation (Room Temperature) | | Joint Strength and Evaluation (260° C.) | |
|---|---|---|---|---|---|---|
| | First Metal Member Made of First Metal Cu | Second Metal Member Made of Second Metal Cu—10Nn | Joint Strength (Nmm$^{-2}$) | Evaluation | Joint Strength (Nmm$^{-2}$) | Evaluation |
| Sn—3Ag—0.5Cu | Electrode of Glass Epoxy Board | External Electrode of Chip Capacitor | 28 | ◉ | 24 | ◉ |
| | | External Electrode of SAW Filter | 29 | ◉ | 24 | ◉ |

| Low Melting Point Metal Composing Joining Material | First Metal and Second Metal | | Content of Remaining Low Melting Point Metal and Evaluation | | Flow Out Percent Defective and Evaluation | | Thermal Shock Test and Evaluation | | |
|---|---|---|---|---|---|---|---|---|---|
| | First Metal Member Made of First Metal Cu | Second Metal Member Made of Second Metal Cu—10Nn | Content (% by volume) | Rating | Percent Defective (%) | Evaluation | Existence or Non-existence of Crack Production | Joint Strength (Nmm$^{-2}$) | Evaluation |
| Sn—3Ag—0.5Cu | Electrode of Glass Epoxy Board | External Electrode of Chip Capacitor | 0 | ◉ | 0 | ◉ | None | 16 | ◉ |

TABLE 4-continued

| | | | | | | | |
|---|---|---|---|---|---|---|---|
| External Electrode of SAW Filter | 0 | ◉ | 0 | ◉ | None | 18 | ◉ |

As shown in Table 4, it was found that also in Example 5, a joined body having characteristics equal to those of samples of Examples 1 to 4 which meet the requirements of the present invention was obtained.

In addition, it is also possible to employ a constitution in which the first metal and the second metal are metal materials composing plating films formed on the surfaces of the first metal member (electrode body) and the second metal member (electrode body) to be joined to each other, respectively, and at least one of the first metal and the second metal is a metal material having a lattice constant difference of 50% or more from the intermetallic compound.

The present invention is not intended to be limited to the above-mentioned examples, and various applications and variations may be made within the scope of the invention regarding types and composition of the low melting point metal composing the joining material, and types and composition of materials composing the first metal member having at least a surface made of a first metal and the second metal member having at least a surface made of a second metal.

Further, various applications and variations may be made also regarding the type of object to be joined by applying the present invention, and conditions in the joining step.

In the present invention, various applications and variations may be made also in other aspects within the scope of the invention.

DESCRIPTION OF REFERENCE SYMBOLS

10 plate-like joining material
11*a* first metal member (first metal)
11*b* second metal member (second metal)
12 Intermetallic compound
64 Laminer intermetallic compound

The invention claimed is:

1. A joint structure comprising:
   a first metal member;
   a second metal member; and
   a joint portion sandwiched between the first metal member and the second metal member,
   wherein at least a Cu-M-Sn intermetallic compound is dispersed in the joint portion, M is at least one of Ni and Mn, and neither a $Cu_3Sn$ layer nor a $Cu_6Sn_5$ layer is present on a first interface between the joint portion and the first metal member and a second interface between the joint portion and the second metal member, and a material of at least one of the first metal member and the second metal member is a Cu—Mn or a Cu—Ni alloy.

2. An electronic device in which the first metal member having at least a surface of a first metal is joined to the second metal member having at least a surface of a second metal with the joint portion sandwiched therebetween, wherein the joint portion has the joint structure according to claim 1.

3. An electronic part comprising:
   a first electrode;
   a second electrode; and
   a joining material in contact with a first surface of the first electrode and a second surface of the second electrode, the joining material including a joining metal of Sn or an alloy containing Sn in an amount of 70% by weight or more,
   wherein the first surface of the first electrode in contact with the joining material is a Cu—Mn alloy or a Cu—Ni alloy which forms an intermetallic compound with the joining metal, and has a lattice constant difference of 50% or more from the intermetallic compound, and
   neither a $Cu_3Sn$ layer nor a $Cu_6Sn_5$ layer is present on a first interface between the joining material and the first electrode and a second interface between the joining material and the second electrode.

4. The electronic part according to claim 3, wherein the first surface of the first electrode in contact with the joining material is a Cu—Mn alloy containing Mn in a proportion of 5 to 30% by weight or a Cu—Ni alloy containing Ni in a proportion of 5 to 30% by weight.

5. The electronic part according to claim 3, wherein the first surface of the first electrode in contact with the joining material is a Cu—Mn alloy containing Mn in a proportion of 10 to 15% by weight or a Cu—Ni alloy containing Ni in a proportion of 10 to 15% by weight.

* * * * *